United States Patent [19]

Shirai

[11] Patent Number: 4,918,028

[45] Date of Patent: Apr. 17, 1990

[54] PROCESS FOR PHOTO-ASSISTED EPITAXIAL GROWTH USING REMOTE PLASMA WITH IN-SITU ETCHING

[75] Inventor: Shigeru Shirai, Nagahama, Japan

[73] Assignee: Canon Kabushiki Kaisha, Tokyo, Japan

[21] Appl. No.: 262,233

[22] Filed: Oct. 21, 1988

Related U.S. Application Data

[63] Continuation of Ser. No. 38,325, Apr. 14, 1987, abandoned.

[30] Foreign Application Priority Data

Apr. 14, 1986 [JP] Japan .................................. 61-85509
Aug. 25, 1986 [JP] Japan .................................. 61-198410

[51] Int. Cl.$^4$ ................... H01L 21/20; H01L 21/306
[52] U.S. Cl. ............................. 437/81; 148/DIG. 29; 148/DIG. 48; 148/33.2; 156/613; 427/38; 437/88; 437/170; 437/173
[58] Field of Search .................. 148/DIG. 29, 41, 22, 148/48, 51, 71, 169, 33-33.3; 156/610-615; 427/35, 42, 38, 39, 53.1, 54.1; 437/18, 19, 81, 88, 103, 104, 170-172, 173, 942, 943, 963, 976, 937

[56] References Cited

U.S. PATENT DOCUMENTS

| | | | |
|---|---|---|---|
| 3,661,637 | 5/1972 | Sirtl | 427/53.1 |
| 4,141,765 | 2/1979 | Druminski et al. | 437/970 |
| 4,174,422 | 11/1979 | Mathews et al. | 148/175 |
| 4,448,801 | 5/1984 | Fukuda et al. | 427/53.1 |
| 4,495,218 | 1/1985 | Azuma et al. | 427/53.1 |
| 4,497,683 | 2/1985 | Celler et al. | 437/112 |
| 4,522,662 | 6/1985 | Bradbury et al. | 437/112 |
| 4,529,474 | 7/1985 | Fujiyama et al. | 118/50.1 |
| 4,529,475 | 7/1985 | Okano et al. | 118/50.1 |
| 4,569,855 | 2/1986 | Matsuda et al. | 427/53.1 |
| 4,581,249 | 4/1986 | Kamiya | 427/53.1 |
| 4,624,736 | 11/1986 | Gee et al. | 118/50.1 |
| 4,636,401 | 1/1987 | Yamazaki et al. | 427/53.1 |
| 4,649,059 | 3/1987 | Eden et al. | 118/50.1 |
| 4,654,226 | 3/1987 | Jackson et al. | 427/54.1 |
| 4,657,616 | 4/1987 | Benzing et al. | 118/50.1 |

Primary Examiner—Brian E. Hearn
Assistant Examiner—William Bunch
Attorney, Agent, or Firm—Fitzpatrick, Cella, Harper & Scinto

[57] ABSTRACT

A process for forming deposited film, which comprises:
(a) the step of preparing a substrate having crystal nuclei or regions where crystal nuclei are selectively formed scatteringly on the surface for forming deposited film in a film forming space for formation of deposited film;
(b) the step of forming deposited film on the above substrate by introducing an activated species (A) formed by decomposition of a compound (SX) containing silicon and a halogen and an activated species (B) formed from a chemical substance for film formation (B) which is chemically mutually reactive on said activated species (A) separately from each other into said film-forming space to effect chemical reaction therebetween;
(c) the step of introducing a gaseous substance (E) having etching action on the deposited film to be formed or a gaseous substance (E$_2$) forming said gaseous substance (E) into said film-forming space during said film-forming step (b) and exposing the deposited film growth surface to said gaseous substance (E) to apply etching action thereon, thereby effecting preferentially crystal growth in a specific face direction;
(d) irradiating said gaseous substance (E) with light energy during said step (c), and
(e) the step of increasing etching activity of said gaseous substance (E) by irradiation of light energy.

10 Claims, 4 Drawing Sheets

PROCESS FOR PHOTO-ASSISTED EPITAXIAL GROWTH USING REMOTE PLASMA WITH IN-SITU ETCHING

This application is a continuation of application Ser. No. 038,325 filed Apr. 14, 1987, now abandoned.

BACKGROUND OF THE INVENTION

1. Field of the Invention

The present invention relates to a process suitable for formation of a functional deposited film containing silicon, especially a polycrystalline silicon-containing deposited film usable suitable for semiconductor devices, photosensitive devices for electrophotography, line sensors for inputting of images, image pick-up devices, etc.

2. Related Background Art

For example, for formation of amorphous silicon films, there have been tried various processes such as vacuum evaporation process, plasma CVD process, CVD process, reactive sputtering process, ion plating process, photo CVD process, etc. and in general the plasma CVD process has been widely employed and commerciallized.

However, deposited films comprising amorphous silicon must be further improved in overall characteristics on electrical and optical characteristics, fatigue characteristics, upon repeated uses, environmental characteristics and productivity and mass-productivity including uniformity and reproducibility.

Especially, for some uses, electrical characteristics, enlargement of area, uniformization of film thickness and uniformity of film quality must be fully satisfied and besides mass-production with high reproducibility must also be attained by high-speed film formation. For this purpose, a heavy equipment investment is required for apparatuses for mass-production in formation of amorphous silicon deposited films by the plasma CVD process. Moreover, control items for the mass-production become complex resulting in less control and further, fine adjustment of apparatuses is necessary. Therefore, these points are further problems to be improved.

On the other hand, normal pressure CVD or LPCVD process have been used for formation of polycrystalline deposited films of silicon, but these processes require high temperature and so substrate materials are limited. Besides, there are difficulties in control of crystal grain size, and of grain size distribution, compensation of defects present in grain boundaries or arrangement of crystal faces. For these reasons, there are also the problems that satisfactory film characteristics cannot be obtained, enlargement of area is difficult, uniform film thickness and quality cannot be obtained, and reproducibility is inferior.

In the plasma CVD process, temperature of substrate can be lowered as compared with the normal pressure CVD process or LPCVD process, but structure of reaction apparatuses is limited to form a stable plasma and further, there are many other parameters (kind of introduction gases, flow rate of gas, pressure, radio frequency power, exhaust velocity, etc), which have great effects on plasma. Therefore, plasma subtly varies due to a slight variation of these parameters or a combination of them, often resulting in adverse effects on uniformity, and electrical and optical characteristics. Furthermore, bombardment of electrons or ions present in plasma against deposited films causes much damage, which is one of factors of deterioration of the film characteristics.

As explained above, at present, both the amorphous silicon film and polycrystalline silicon film have problems which are due to their process of formation. Especially, from the points of improvement and stabilization of electrical characteristics of deposited films, in formation of polycrystalline silicon films, development of a process for forming a polycrystalline silicon film of a large area at low cost with keeping practicably sufficient characteristics, uniformity, and stability has been demanded.

The photo-CVD process has been proposed for solving the above problems, but according to the conventional photo-CVD process, it is difficult to produce a polycrystal deposited film while controlling crystal grain side and grain size distribution, electrical characteristics of grain boundaries are insufficient, and besides control of face direction is also difficult. Further, the photo-CVD process has limitation in usable raw material gases, and this process is not profitable in productivity and cost.

SUMMARY OF THE INVENTION

The primary object of the present invention is to provide a novel process for forming a polycrystalline deposited film which is free from the defects of the above mentioned conventional method such as normal pressure CVD process, LPCVD process, plasma CVD process, and photo-CVD process, and which is not according to the conventional processes.

Another object of the present invention is to provide a process for forming a polycrystalline deposited film which is suitable for enlargement of area of the film and which can easily attain improvement of productivity and mass production of the film contributing to the improvement of various characteristics of the produced polycrystalline film, film forming speed and reproducibility, and homogenization of the film quality.

According to the present invention, there is provided a process for forming deposited film, which comprises:

(a) the step of preparing a substrate having crystal nuclei or regions where crystal nuclei are selectively formed scatteringly on the surface for forming deposited film in a film forming space for formation of deposited film;

(b) the step of forming deposited film on the above substrate by introducing an activated species (A) formed by decomposition of a compound (SX) containing silicon and a halogen and an activated species (B) formed from a chemical substance for film formation (B) which is chemically mutually reactive on said activated species (A) separately from each other into said film-forming space to effect chemical reaction therebetween;

(c) the step of introducing a gaseous substance (E) having etching action on the deposited film to be formed or a gaseous substance ($E_2$) forming said gaseous substance (E) into said film-forming space during said film-forming step (b) and exposing the deposited film growth surface to said gaseous substance (E) to apply etching action thereon, thereby effecting preferentially crystal growth in a specific face direction;

(d) irradiating said gaseous substance (E) with light energy during said step (c), and (e) the step of increasing etching activity of said gaseous substance (E) by irradiation of light energy.

DETAILED DESCRIPTION OF THE PREFERRED EMBODIMENT

Figure 1:
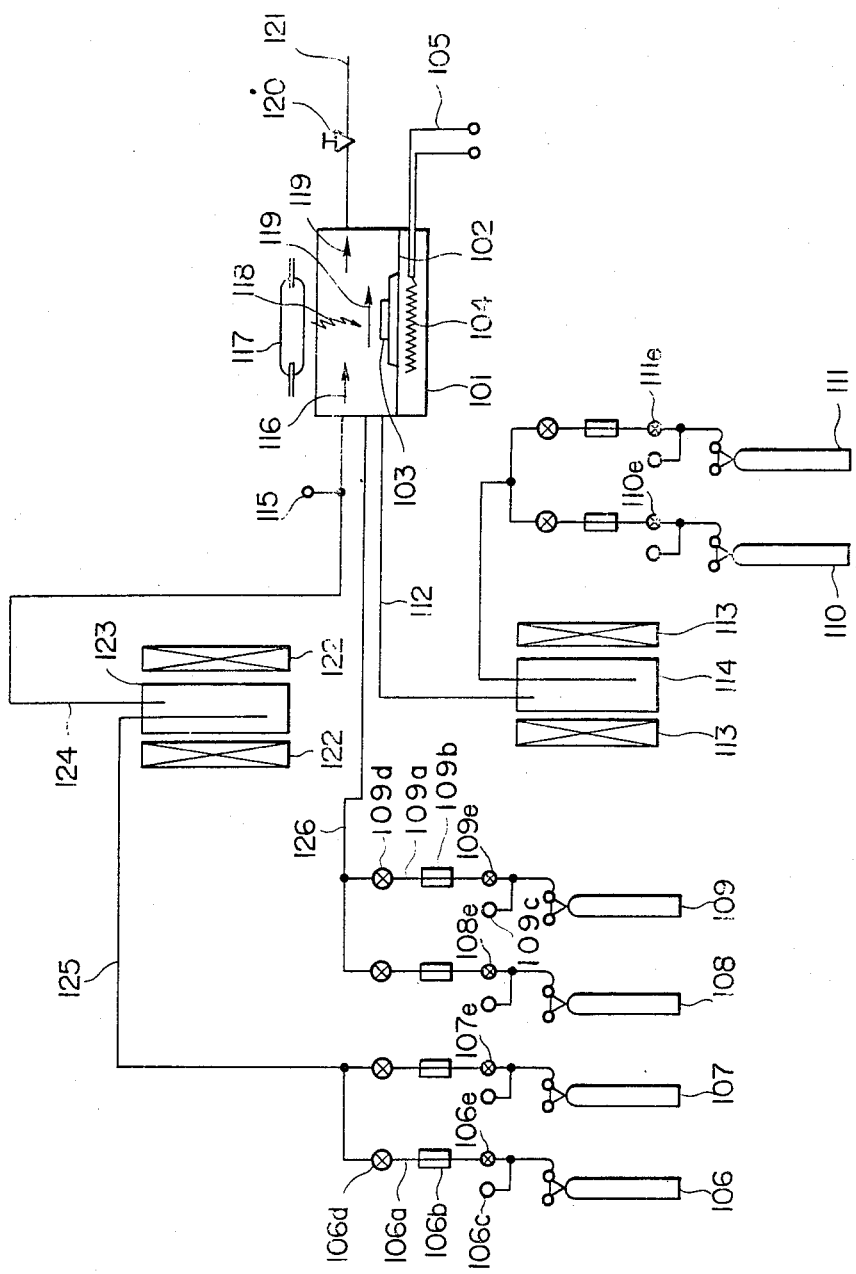
FIG. 1 illustrates schematically the constitution of an example of the device for forming deposited film embodying the process of the present invention.
Figure 2:
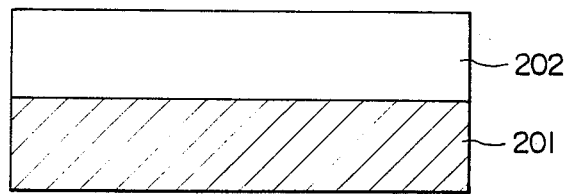
FIG. 2 illustrates schematically a deposited film prepared according to the process of the present invention.

As the compound (SX) containing silicon and halogen which is introduced into the activation space (A), there may be used, for example, chain or cyclic silane compounds of which hydrogen atoms are all or partially substituted by halogen atoms. As examples of these compounds, mention may be made of chain silicon halides represented by the formula $Si_uY_{2u+2}$ (u is an integer of 1 or more and Y is at least one element selected from F, Cl, Br and I), cyclic silicon halides represented by the formula $Si_vY_{2v}$ (v is an integer of 3 or more and Y is the same as defined above), chain or cyclic compounds represented by the formula $Si_uH_xY_y$ (u and Y are the same as defined above and $x+y=2u$ or $2u+2$), etc.

Typical examples of these compounds are those which are gas or can easily be gasified such as $SiF_4$, $(SiF_2)_5$, $(SiF_2)_6$, $(SiF_2)_4$, $Si_2F_6$, $Si_3F_8$, $SiHF_3$, $SiH_2F_2$, $SiCl_4$, $(SiCl_2)_5$, $SiBr_4$, $(SiBr_2)_5$, $Si_2Cl_6$, $Si_2Br_6$, $SiHCl_3$, $SiH_3Cl$, $SiH_2Cl_2$, $SiHBr_3$, $SiHI_3$, $Si_2Cl_3F_3$, etc.

For formation of active species (A), if necessary, in combination with said compounds (SX) containing silicon and halogen there may be used single substance of silicon, other silicon compounds, hydrogen, halogen compounds (e.g., $F_2$ gas, $Cl_2$ gas, gasified $Br_2$, $I_2$, etc.), etc.

For production of active species (A) in the activation space (A) in the present invention, there may be used, considering the conditions and apparatuses, activation energies such as electric energies, e.g., microwave, RF, low frequency, DC, etc., heat energies such as heater heating, infrared heating, etc. and light energy.

The active species (A) is produced by applying activation energies such as heat, light, electricity or the like to the compounds referred to above in the activation space (A).

As the film-forming chemical substances (B) which produce active species (B) in the activation space (B) in the process of the present invention, hydrogen gas and/or halogen compounds (e.g., $F_2$ gas, $Cl_2$ gas, gasified $Br_2$, $I_2$, etc.) may be advantageously used. In addition to these film-forming chemical substances (B), for example, inert gases such as helium, argon, neon, etc. may also be used. When a plurality of these film-forming chemical substances (B) are used, these may be previously mixed and introduced in the form of gas into the activation space (B) or these substances in the form of gases may be separately supplied from separate supply sources and introduced into the activation space (B) or they may be separately introduced into separate activation spaces and separately activated.

Ratio of amount of the active species (A) and that of the active species (B) introduced into the film-forming space is suitably and desirably selected depending upon film-forming conditions, kind of the active species, etc. and preferably 10:1–1:10 (introduction flow rate ratio) and more preferably 8:2–4:6. In the present invention, as the active species (A) introduced into the film forming space generated from activation species (A), there may be appropriately selected and used those which have a life of preferably 0.1 second or more, more preferably 1 second or more and most preferably 10 seconds or more in view of productivity and easiness in handling. The constituting elements of this active spcies (A) constitute the ingredients of deposited film formed in the film-forming space. The film-forming chemical substance is activated by the action of activation energy in activation space (B) and is introduced into the film-forming space, where it interacts with active species (A) which is simultaneously introduced from activation space (A) and which contains the constituting element which becomes ingredient of the deposited film to be formed. As a result, a deposited film can be easily formed on the desired substrate.

In the present invention, during the film forming step, there is (a) etching action applied to the growth surface of deposited film during film formation at the same time, or (b) etching action is applied to the growth surface of deposited film with intermission for film formation, whereby crystal growth can be effected preferentially in a specific face direction to give a deposited film with good crystallinity. The etching action in the case of the above (b) may be effected within the film-forming space or alternatively in an etching space separate from the film forming space.

As the gaseous or readily gasifiable substance for etching (E) having etching action on the deposited film containing silicon, there may be included single substances of halogen, halide compounds or activated species (C) formed from these.

These substances (E) for etching may be introduced under gaseous state into the space where etching action is applied, or alternatively in the case when the substance (E) is formed by the surface reaction on the surface of the deposited film of the above activated species (A) or the above activated species (B), formed from the chemical reaction between the activated species (A) and the activated species (B), etching action is applied to the growth surface of the deposited film simultaneously with film formation.

For example, as an example in which the substance for etching is formed by the above surface reaction, the reaction between an activated species of halogen and hydrogen or a halogen and activated species of hydrogen occurs on the growth surface of the deposited film, and hydrogen halide (HX) is released from the growth surface of the deposited film and the hydrogen halide becomes the substance (E) for etching.

As gaseous substances (E) having etching action used in the present invention, mention may be made of halogens such as $F_2$, $Cl_2$, gasified $Br_2$, $I_2$, etc., halides such as carbon halides, e.g., $CHF_3$, $CF_4$, $C_2F_6$, $CCl_4$, $CBrF_3$, $CCl_2F_2$, $CCl_3F$, $CClF_3$, $C_2Cl_2F_4$, etc., boron halides, eg., $BCl_3$, $BF_3$, etc., halides such as $SF_6$, $NF_3$, $PF_5$, $XeF_2$, etc., radicals produced from these gases such as $F^*$, $Cl^*$, etc. and ions such as $CF_3^+$, $CCl_3^+$, etc. These may also be used in combination of two or more and further, gases such as $O_2$, $H_2$, and the like in an amount not to affect the film to control the etching characteristics.

The growth surface of deposited film is etched in the following manner with the gaseous substance (E). An etching space is arranged separately from the film-forming space, and the film formation and etching may be performed by alternately repeating. Alternatively, the gaseous substance (E) is introduced in a state of having etching activity and the etching action is carried out simultaneously or alternately with film formation to limit the crystal growth direction of the deposited film, thereby to attain the object of the present invention.

Furthermore, since the deposited film formed by the process of the present invention has sufficient semiconductor characteristics, the film may be subjected to doping with an impurity element during or after the film formation. As typical examples of the impurity elements used, mention may be made of elements of Group III A of the periodic table such as B, Al, Ga, In, Tl, etc. as p-type impurities, and those of Group V A of the periodic table such as P, As, Sb, Bi, etc. as n-type impurities. Especially preferred are B, Ga, P, and Sb. Amount of the impurities to be doped is suitably determined depending on the desired electrical and optical characteristics.

As substances (D) containing such impurity element as a component (substances for introduction of impurity), it is preferred to choose those compounds which are in a gaseous state at normal temperature and pressure or are gases at least under activation conditions and can be easily vaporized by a suitable vaporizer. As examples of such compounds, mention may be made of $PH_3$, $P_2H_4$, $PF_3$, $PF_5$, $PCl_3$, $AsH_3$, $AsF_3$, $AsF_5$, $AsCl_3$, $SbH_3$, $SbF_5$, $BiH_3$, $BF_3$, $BCl_3$, $BBr_3$, $B_2H_6$, $B_4H_{10}$, $B_5H_9$, $B_5H_{11}$, $B_6H_{10}$, $B_6H_{12}$, $AlCl_3$, etc. These compounds (D) containing impurity elements may be used alone or in combination of two or more.

The compound (D) containing impurity element as a component may be directly introduced, in a gaseous state, into the film forming space or may be previously activated in activation space (A) or (B) or a third activation space (C) and then introduced into the film-forming space.

On the other hand, the dependency of growth speed upon face direction has been found during crystal growth of silicon or silicon-containing materials. This may differ depending on the deposited film forming method or deposition conditions, but in the method of the present invention, the preferential order has been found to be (110)>(111)>(100). By suitable selection of the kind of substance (E) for etching and etching condition under this condition, the condition with stronger orientability of (110)>>(111)>>(100) can be realized. It is realized in the present invention to strengthen the above orientability and accelerate the growth speed, particularly by setting a portion for accelerating nucleation on the substrate. And, not only formation of polycrystalline deposited film with great grain size oriented only toward the (110) face is possible, but it is also possible to grow a single crystal by selecting the size, shape, interval, material, etc., of the nucleus.

In the present invention, the expression crystalline deposited film of course represents a polycrystalline and a single crystal film. The surface for promoting nucleation of the present invention may sometimes exist on the whole surface of the substrate, or sometimes as a part thereof, or otherwise many portions may be provided as separately dispersed. As the property demanded for the portion for promoting nucleation, it must be considered that the active species (A) in the vicinity of the substrate formed from compounds containing silicon and a halogen has a great coefficient of attachment. In order to enhance the coefficient of attachment, a material having a large coefficient of attachment may be employed or a surface structure for enhancing the coefficient of attachment may be formed. Coefficient of attachment generally refers to a quantity which is a measure for readiness in chemical adsorption to occur, and in the case of the present invention, physical adsorption and chemical adsorption including dissociation are also included. As the material enhancing the coefficient of attachment, those with surface unevenness of some 1000Å or less are preferred. As to the shape, those with shapes as regular as possible rather than random are preferred.

The material having a large coefficient of attachment may be selected from among insulating substances and semiconductive substances such as Si:N:H, $Si_3N_4$, A-Si:H, Si:N:O:H, $Al_2O_3$, $SiO_2$, $Ta_2O_5$, etc., but particularly a compound containing Si-N is preferred. Also, a metal material may be sometimes employed. As mentioned above, the order of stronger orientability of crystal has been made as (110)>(111)>(100), but of course it is possible in the present invention to control the direction of oriented surface and the direction of the single crystal growth face depending on the conditions of deposition and nucleus.

The portion for promoting nucleation of the present invention do not have to be uniformly spread over the whole substrate surface, but a film with regular sized of crystal grains and crystal axis directions may be obtained by giving places where nuclei are liable to be generated locally.

In the process of the present invention, it is necessary for selective formation of crystalline deposited film having desired face direction that crystal nuclei of the deposited film to be formed or regions which can selectively form crystal nuclei are previously and dispersively arranged on the surface of a substrate to be formed depending on the purposes.

For example, a single crystal substrate of which deposited film formation surface is partially covered with an amorphous thin film is used as a substrate or single crystal grains are dispersively arranged on a substrate, whereby the growth of crystal occurs at the exposed portion of the single crystal substrate or on the single crystal grains and epitaxial growth selectively occurs.

Specifically, for example, there may be used silicon single crystal substrate of which deposited film formation surface is partially covered with a silicon oxide film to selectively expose the basic silicon single crystal surface or a substrate of silicon crystal small in growth property in which silicon single crystal grains are selectively arranged on the deposited film formation surface. Furthermore, there may be used a crystal material different from silicon as a nucleus in place of the silicon single crystal substrate or the silicon single crystalline grain, but such crystal materials must meet the following conditions:

1. The crystal lattice constant on the crystalline substrate surface is the same as or very close to that of deposited film.

2. The coefficient of thermal expansion of the portion on the substrate surface is the same as or very close to that of the deposited film.

Taking the above conditions into consideration, specific materials to form the surface of the substrate for obtaining a deposited film of crystalline material Si to accomplish the objects of the present invention include $GaF_2$, $ZnS$, $Yb$, $Mn_3Ga$, $NaCoF_3$, $Ni_3Sn$, $Fe_3C$, $NiTe_x$ ($X<0.7$), $CoMnO_3$, $NiMnO_3$, $MaZn_3$, $CuCl$, $AlP$, $Si$, etc. Even if the material does not meet the above two conditions in some degree, it is possible to obtain a silicon deposited film of the crystalline material by more suitably choosing the film forming conditions. Thus, the process of the present invention is not always limited to use of the above materials.

Also, as the process for forming selectively a crystalline Si deposited film by selecting suitably the film-forming conditions and the kind of the substrate, there is the process in which the following kind of substrate is used. That is, it is the process for preparing a crystalline film by utilizing the difference in nucleation density according to the kind of the material constituting the nucleation surface for forming crystal nuclei, and the substrate used in said process has nucleation surfaces arranged scatteringly with a desired pattern on the non-nucleation surface. By use of such a substrate, a crystalline film can be selectively grown from said nucleation surfaces.

As such substrate, there may be specifically used, for example, an $SiO_2$ film on which $Si_3N_4$ is discretely arranged or an $Si_3N_4$ film which is covered with $SiO_2$ to partially expose the basic $Si_3N_4$ film.

This utilizes the properties of silicon crystal nuclei being produced with ease on $Si_3N_4$ surface and with difficulty on $SiO_2$ surface. In the process for formation of deposited film of the present invention, materials having differences in difficulty in formation of nuclei can be used regardless of amorphous or crystalline materials without such limitation.

In the present invention, when a gaseous substance (E) having etching action is permitted to exist in the film-forming space and the deposited film growth surface is exposed to said gaseous substance (E), etching action is promoted by irradiating said gaseous substance (E) with light energy. As the method for irradiation of light energy, there may be employed the method in which irradiation is effected toward the deposited film growth surface continuously or intermittently, whereby the irradiated light energy is permitted to act on the above gaseous substance (E) in the optical pathway of irradiation. As the light energy, energy of light having wavelength from far infrared so far ultraviolet can be used, including specifically strong luminosity light such as laser beam, halogen lamp rays, mercury lamp rays, etc. Irradiation of light energy can be effected during the whole time or during the partial time in the etching action step.

As mentioned above, according to the present invention, the process can be made a more stable CVD process by optionally controlling the atmospheric temperature of the film-forming space and the substrate temperature.

One of the differences between the process of the present invention and the conventional CVD process is that the former uses active species which have previously been activated in a space (referred to as "activation space" hereinafter) different from the film-forming space.

Based on this flat, film forming speed can be markedly increased than that of the conventional CVD process and b sides the substrate temperature at the time of forming the deposited film can be further lowered and thus it has become possible to provide deposited films of stable quality industrially in a large quantity and at low costs.

The second difference of the present invention from the conventional CVD process is to form a polycrystalline deposited film by preferentially carrying out crystal growth in a specific face direction of crystal due to the etching effect of a gaseous substance (E) having etching activity or a gaseous substance (E2) having potential etching activity or a decomposition product thereof introduced from outside simultaneously with the formation of deposited film.

Furthermore, according to the present invention, the etching effect on said film-growing surface is aided by irradiation of light energy which provides etching selectivity. That is, a gaseous substance (E) having etching action is excited with light to increase etching activity and promote the crystal growth in a specific direction. This irradiation of light energy can be selected so that it can more efficiently act on the etching gas.

Referring to the accompanying drawings, on example of the deposited film forming process of the present invention will be explained below with reference to deposition of a polycrystalline silicon film.

FIG. 1 is a schematic view which illustrates outline of one example of an apparatus for formation of a deposition film to embody the process of the present invention.

In FIG. 1, 101 indicates a deposition chamber where deposition of a polycrystalline silicon film is effected and the inside of deposition chamber 101 is connected to an exhaust system (not shown) through an exhaust pipe 121, whereby inside of deposition chamber 101 can be maintained at a desired pressure by an exhaust valve 120. The pressure in the deposition chamber 101 is adjusted to generally $10^{-5}$ Torr–1.0 Torr preferably $10^{-4}$ Torr–0.1 Torr. In the deposition chamber 101, a desired substrate 103 is put on a substrate supporting stand 102.

104 indicates a heater for heating the substrate which is supplied with electricity through electric lead 105 to develop heat. The substrate temperature has no special limitation, but preferably 100°–500° C., more preferably 150°–400° C. for practice of the process of the present invention.

106–111 indicate gas supply sources, which are provided depending on the number of silicon compounds and hydrogen, halogen compound, inert gas and compound containing impurity element which are used, if necessary. If a liquid raw material compound is used, an optional vaporizer is also provided. 106a–111a indicate branch pipes, 106b–111b indicate flowmeters, 106c–111c indicate pressure gases for measurement of pressure at higher pressure side of each flowmeter, and 106d–111d and 106e–111e indicate valves for adjustment of respective gas flow rate. 112, 125 and 126 indicate pipes for introduction of gas into film forming space.

117 indicates a light energy-generating device such as mercury lamp, xenon lamp, carbon dioxide laser, argon ion laser, excimer laser.

Light 118 directed to the whole substrate or desired part of the substrate from the light energy-generating device 17 by a suitable optical system is irradiated to a gaseous substance (E) having etching action flowing in the direction of arrow 119.

114 and 123 indicate activation spaces for producing active species (A) and active species (B), respectively and 113 and 122 indicate devices for generation of microwave plasma for production of the active species.

The following examples further illustrate this invention.

EXAMPLE 1

Using the apparatus of FIG. 1, a deposited film was formed according to the process of the present invention in the following manner.

Substrate 103 was produced by the steps as shown in FIG. 4.

First, polycrystalline silicon substrate 401 as shown by (A) in FIG. 4 was cleaned, followed by depositing a silicon oxide thin film 402 on the whole surface of the substrate by the sputtering process (various thin film deposition process other than the sputtering process, e.g. the vacuum evaporation process, sputtering process, plasma discharge process, MBE process, CVD process, etc. can be employed.) [(B) in FIG. 4].

Then, on the thin film 402 was coated by an electron radiation resist 403 [(C) in FIG. 4], which was then selectively exposed using a photo mask having desired pattern and developed to partially remove the resist 403 [(D) in FIG. 4].

Silicon oxide thin film 402 was selectively etched using the remaining electron radiation resist 403 as a mask to form the thin film 402A of desired pattern [(E) in FIG. 4].

Through the above steps, there was obtained a silicon substrate 103 having a portion 401 in which the polycrystalline silicon is exposed at constant intervals from thin films 402A. The exposed parts 401A of the silicon crystal have a diameter of about several hundreds Å and are at intervals of 5 $\mu$m.

Then, the deposition chamber 101 was subjected to internal evacuation by an evacuation device (not shown) to reduce the inner pressure to about $10^{-6}$ Torr. 50 sccm of $H_2$ gas was introduced into an activation chamber (B) 123 through a gas introduction pipe 125 from a gas supply bomb. The $H_2$ gas, etc. introduced into the activation chamber (B) 123 were converted by a microwave plasma generating device 122 to active species (B) such as hydrogen, etc., which were introduced into the film forming chamber 101 through an introduction pipe 124.

Into an activation chamber (A) 114 was introduced 20 sccm of $SiF_4$ gas through a gas introduction pipe 112. The $SiF_4$ gas introduced into the activation chamber (A) 114 was converted by the activation with microwave plasma generating device 113 to active species (A) such as $SiF_2$, etc. and introduced into a film-forming chamber 101 through an introduction pipe 112.

Furthermore, 10 sccm of $F_2$ gas as an etching gas was introduced into the film-forming chamber 101 through a gas introduction pipe 126.

With keeping the inner pressure of film forming chamber 101 at 0.02 Torr, light from 1 KW Xe lamp was vertically irradiated onto the substrate 103 previously heated to 350° C. by the heater 104 to react the active species with each other, thereby to form a polycrystalline silicon film and simultaneously, $F_2$ gas was activated by said irradiation with light to produce F* fluorine free radical and polycrystalline silicon film strong in certain orientation was formed by etching said polycrystalline film as deposited utilizing difference in etching speed of said fluorine free radical depending on crystal faces. In this case, difference in etching speed depending on crystal faces is $(1, 0, 0) > (1, 1, 1) > (1, 1, 0)$ and a polycrystalline silicon film having $(1, 1, 0)$ as a main crystal face was formed on substrate. This fact was confirmed in the following manner. According to evaluation by X-ray diffraction of this sample, peak intensity at crystal angle $(2\theta) = 47.3°$ which reflected the $(1, 1, 0)$ face was 7-10 times those at crystal angle $(2\theta) = 28.4°$ and 69.2° which reflected the $(1, 1, 1)$ face and $(1, 0, 0)$ face, respectively.

The cross section of thus obtained silicon deposited film on the substrate 103 was diagrammatically shown in (F) of FIG. 4.

Each deposited film sample was evaluated by X-ray diffractometry and electron diffractometry to find that they were polycrystalline silicon films. Size of crystal grains 404 was determined so that grain boundaries 405 are in equal distance from exposed parts 401A of the crystal substrate 401 from which the silicon oxide layer 402A was removed. Observation by a transmission type electron microscope revealed that grain diameter of the polycrystalline silicon was about $5 \pm 0.2$ $\mu$m. There were substantially no scatters of grain diameter on overall surface of the substrate.

According to observation of surface state of the samples by a scanning type electron microscope, they had good smoothness, no ripples and film thickness unevenness t is $\pm 4\%$ or less.

Then, the thus obtained polycrystalline silicon film samples were put in a vacuum evaporation tank, where comb-shaped Al gap electrode (length 250 $\mu$, 5 mm) was made under a degree of vacuum of $10^{-5}$ Torr and then dark current was measured at applied voltage 10V and dark current $\sigma d$ was obtained, thereby to evaluate the polycrystalline silicon film.

The above mentioned film forming conditions and results of evaluation of the deposited films are shown in Tables 1 and 2, respectively.

TABLE 1

|  | Gas | Flow rate (SCCM) | Discharge power (W) | Substrate temperature (°C.) | Inner pressure (Torr) | Light source | Film forming speed (Å/S) |
|---|---|---|---|---|---|---|---|
| Activation space (A) | $SiF_4$ | 20 | 500 |  |  | Xe lamp |  |
| Activation space (B) | $H_2$ | 50 | 200 | 350 | 0.02 | 1KW | 2 |
| Etching conditions | $F_2$ | 10 |  |  |  |  |  |

TABLE 2

| Sample No. | σ d (Ω cm$^{-1}$) | X-ray diffraction (2,2,0)/(1,1,1) | (1,1,0)/(4,0,0) | Grain size (μm) | H content (atomic %) |
|---|---|---|---|---|---|
| 1 | 8.1 × 10$^{-4}$ | 7/1 | 10/1 | 5.0 | 0.05 |

*In table 2, 3, 4, 5, 7, 9 and 11 (2, 2, 0)/(1, 1, 1) and (2, 0, 0)/(4, 0, 0) are ratio of peak intensity reflecting $I/I_0$ of each crystal face and ASTM card.

EXAMPLE 2

Substrate 103 was produced by the steps shown in FIG. 5.

Substrate 506 comprising a homogeneous material as shown in (A) of FIG. 5 was cleaned and subsequently, (amorphous SiN referred to as A-SiN) thin film 507 was formed at a thickness of about 2 μm on the whole surface of substrate 506 by CVD process [(B) in FIG. 5].

Then, the surface of the A-SiN thin film 507 was subjected to surface annealing in $N_2$ atmosphere by a laser annealing apparatus to form crystalline substance $Si_3N_4$ (referred to as C-$Si_3N_4$) 508 to the depth of 1 μm of the surface layer of A-SiN thin film 507 [(C) in FIG. 5].

In this case, laser of ArF laser 193 nm, pulse width 50 nsec, and average power density 100 mJ/cm$^2$ was used and irradiation was carried out at 40 pu/se. Then, the surface of this C-$Si_3N_4$ 508 was subjected to scanning by said laser annealing apparatus in $O_2$ atmosphere to selectively form $SiO_2$ region 509 [(D) in FIG. 5].

By the above steps, there was formed substrate 103 where C-$Si_3N_4$ regions 508A were exposed at constant intervals from the $SiO_2$ region 509 and other parts were covered with $SiO_2$ 509. The exposed C-$Si_3N_4$ regions 508A on the substrate surface had a diameter of about 4Å and were at intervals of 3 μm.

Deposition of crystalline silicon was further carried out using this substrate 103 under the same conditions as used in Example 1 and by the apparatus shown in FIG. 1.

Section of the crystalline silicon deposited film formed on this substrate 103 is diagrammatically shown in (E) of FIG. 5.

The thus obtained samples were subjected to evaluation of crystalline property by X-ray diffractometry and electron diffractometry to find that they were polycrystalline silicon films. Size of crystal grains 504 was determined so that grain boundaries 505 were in equal distance from the C-$Si_3N_4$ regions 508A. Grain diameter of the polycrystalline silicon was about 3±0.5 μm. A few scatters of grain diameter were seen over-all surface of the substrate.

The surface state was observed by a scanning type electron microscope to find that the surface had good smoothness, no ripples and film thickness uneveness t was ±4% or less.

TABLE 3

| Sample No. | $σ_d$ (Ω cm$^{-1}$) | X-ray diffraction (2,2,0)/(1,1,1) | (2,2,0)/(4,0,0) | Grain size (μm) | H content (atomic %) |
|---|---|---|---|---|---|
| 2 | 9.1 × 10$^{-5}$ | 7/1 | 10/1 | 3.0 | 0.07 |

EXAMPLE 3

Films were formed under the same conditions as in Example 2 except that kind and flow rate of gases were changed as shown in Table 4. The results of evaluations are shown in Table 5.

TABLE 4

| | | Sample No. | | | | | |
|---|---|---|---|---|---|---|---|
| | | 3-1 | 3-2 | 3-3 | 3-4 | 3-5 | 3-6 |
| Activation space (A) | Gas flow rate (SCCM) | $Si_2F_6$ 10 | $SiH_2F_2$ 20 | $SiCl_4$ 20 | $SiH_2Cl_2$ 20 | $SiF_4$ 20 | Ar 50 | $SiF_4$ 20 |
| Activation space (B) | Gas flow rate (SCCM) | $H_2$ 50 | $H_2$ 30 | $H_2$ 50 | $H_2$ 30 | $H_2$ 50 | Ar 50 | $H_2$ 50 |
| Etching gas | Gas flow rate (SCCM) | $F_2$ 10 | $F_2$ 10 | $F_2$ 10 | $F_2$ 10 | $F_2$ 10 | $Cl_2$ 10 |

TABLE 5

| Sample No. | $σ_d$ (Ω cm$^{-1}$) | X-ray diffraction (2,2,0)/(1,1,1,) | (2,2,0)/(4,0,0) | Grain size (μm) | H content (atomic %) |
|---|---|---|---|---|---|
| 3-1 | 7.0 × 10$^{-5}$ | 6/1 | 8/1 | 2.8 | 0.05 |
| 3-2 | 3.1 × 10$^{-4}$ | 12/1 | 20/1 | 3.2 | 0.03 |
| 3-3 | 9.0 × 10$^{-5}$ | 8/1 | 12/1 | 3.5 | 0.02 |
| 3-4 | 2.0 × 10$^{-4}$ | 10/1 | 14/1 | 3.0 | 0.03 |
| 3-5 | 1.0 × 10$^{-4}$ | 8/1 | 11/1 | 3.1 | 0.01 |
| 3-6 | 1.4 × 10$^{-4}$ | 8/1 | 12/1 | 3.1 | 0.02 |

EXAMPLE 4

Films were formed under the same conditions as in Example 1 except that a doping gas was introduced into the activation space (A) under the conditions as shown in Table 6.

Results of evaluation are shown in Table 7.

TABLE 6

| | Sample No. | | | |
|---|---|---|---|---|
| | 4-1 | 4-2 | 4-3 | 4-4 |
| Activation space (A) Gas flow rate (SCCM) | SiF$_4$ 20 | SiF$_4$ 20 | SiF$_4$ 20 | SiF$_4$ 20 |
| Doping gas concentration (ppm) | BF$_3$ 100 | BF$_3$ 500 | BF$_5$ 100 | BF$_5$ 500 |

*Concentration is a ratio of flow rates of doping gas and raw-material gas (SiF$_4$ gas) and doping gas is hydrogen diluted to 3000 ppm.

TABLE 7

| Sample No. | $\sigma_d$ ($\Omega$ cm$^{-1}$) | X-ray diffraction (2,2,0)/(1,1,1) | (2,2,0)/(4,0,0) | Grain size ($\mu$m) | H content (atomic %) |
|---|---|---|---|---|---|
| 4-1 | 2.0 × 10$^{-2}$ | 7/1 | 10/1 | 5.2 | 0.02 |
| 4-2 | 8.0 × 10$^{-2}$ | 8/1 | 12/1 | 5.3 | 0.03 |
| 4-3 | 1.3 × 10$^{-2}$ | 7/1 | 10/1 | 5.2 | 0.02 |
| 4-4 | 7.0 × 10$^{-2}$ | 8/1 | 12/1 | 5.4 | 0.03 |

EXAMPLE 5

Films were formed under the same conditions as in Example 2 except that a halogen-containing gas was introduced into the film forming space under the conditions as shown in Table 8.

Results of evaluation are shown in Table 9.

TABLE 8

| | Sample No. | | | | |
|---|---|---|---|---|---|
| | 5-1 | 5-2 | 5-3 | 5-4 | 5-5 |
| Gas | F$_2$ | F$_2$ | F$_2$ | F$_2$ | F$_2$ |
| Flow rate | 0 | 5 | 10 | 50 | 100 |

TABLE 9

| Sample No. | $\sigma$ d ($\Omega$ cm$^{-1}$) | X-ray diffraction (2,2,0)/(1,1,1) | (2,2,0)/(4,0,0) | Grain size ($\mu$m) | H content (atomic) % |
|---|---|---|---|---|---|
| 5-1 | 4.0 × 10$^{-5}$ | 2/1 | 3/1 | 2.3 | 0.06 |
| 5-2 | 7.0 × 10$^{-5}$ | 4/1 | 6/1 | 2.5 | 0.04 |
| 5-3 | 9.0 × 10$^{-5}$ | 6/1 | 8/1 | 2.9 | 0.03 |
| 5-4 | 1.3 × 10$^{-4}$ | 10/1 | 15/1 | 3.5 | * |
| **5-5 | — | — | — | — | — |

*H was not detected.
**In the case of sample 4-5, no film was formed and Si wafer for IR analysis was etched.

EXAMPLE 6

Films were formed under the same conditions as in Example 2 except that the discharge power in the activation space (A) and activation space (B) was changed as shown in Table 10.

Results of evaluation are shown in Table 11.

TABLE 10

| | Sample No. | | | | | | | |
|---|---|---|---|---|---|---|---|---|
| | 6-1 | 6-2 | 6-3 | 6-4 | 6-5 | 6-6 | 6-7 | 6-8 |
| Discharge power in (A) (W) | 100 | 300 | 700 | 1000 | 500 | 500 | 500 | 500 |
| Discharge power in (B) (W) | 200 | 200 | 200 | 200 | 50 | 100 | 300 | 500 |

TABLE 11

| Sample No. | $\sigma$ d ($\Omega$ cm$^{-1}$) | X-ray diffraction (2,2,0)/(1,1,1) | (2,2,0)/(4,0,0) | Grain size ($\mu$m) | H content (atomic) % |
|---|---|---|---|---|---|
| 6-1 | 3.0 × 10$^{-5}$ | 4/1 | 5/1 | 2.7 | 0.06 |
| 6-2 | 7.0 × 10$^{-5}$ | 5/1 | 8/1 | 2.8 | 0.04 |
| 6-3 | 2.0 × 10$^{-4}$ | 9/1 | 13/1 | 3.2 | 0.01 |
| 6-4 | 9.0 × 10$^{-5}$ | 7/1 | 10/1 | 3.2 | *— |
| 6-5 | 5.0 × 10$^{-5}$ | 5/1 | 7/1 | 2.8 | *— |
| 6-6 | 9.0 × 10$^{-5}$ | 6/1 | 9/1 | 3.0 | 0.01 |
| 6-7 | 1.2 × 10$^{-4}$ | 7/1 | 10/1 | 3.2 | 0.03 |
| 6-8 | 9.0 × 10$^{-5}$ | 7/1 | 10/1 | 3.1 | 0.04 |

*H was not detected.

TABLE 12

| | Sample No. | | | | |
|---|---|---|---|---|---|
| | 7-1 | 7-2 | 7-3 | 7-4 | 7-5 |
| Substrate temperature (°C.) | 50 | 150 | 250 | 450 | 650 |

EXAMPLE 7

Films were formed under the same conditions as in Example 12 except that the substrate temperature was changed as indicated in Table 12. Results of evaluation are shown in Table 13.

TABLE 13

| Sample No. | $\sigma d$ ($\Omega\ cm^{-1}$) | X-ray diffraction (2,2,0)/(1,1,1) | (2,2,0)/(4,0,0) | Grain size ($\mu m$) | H content (atomic) % |
|---|---|---|---|---|---|
| 7-1 | $2.1 \times 10^{-6}$ | 1/1 | 2/1 | 1.1 | 1.0 |
| 7-2 | $9.0 \times 10^{-6}$ | 2/1 | 4/1 | 1.5 | 0.6 |
| 7-3 | $5.0 \times 10^{-5}$ | 4/1 | 7/1 | 2.0 | 0.2 |
| 7-4 | $1.0 \times 10^{-4}$ | 10/1 | 12/1 | 3.4 | 0.05 |
| 7-5 | $8.0 \times 10^{-5}$ | 12/1 | 15/1 | 3.5 | *— |

*H was not detected.

EXAMPLE 8

Films were formed under the same conditions as in Example 2 except that the inner pressure was changed as shown in Table 14. Results of evaluation are shown in Table 15.

TABLE 14

| | Sample No. | | | | |
|---|---|---|---|---|---|
| | 8-1 | 8-2 | 8-3 | 8-4 | 8-5 |
| Inner pressure (Torr) | 0.0001 | 0.001 | 0.01 | 0.1 | 1.0 |

TABLE 15

| Sample No. | $\sigma d$ ($\Omega\ cm^{-1}$) | X-ray diffraction (2,2,0)/(1,1,1) | (2,2,0)/(4,0,0) | Grain size ($\mu m$) | H content (atomic) % |
|---|---|---|---|---|---|
| 8-1 | $3.0 \times 10^{-4}$ | 8/1 | 15/1 | 3.3 | 0.02 |
| 8-2 | $2.0 \times 10^{-4}$ | 7/1 | 13/1 | 3.2 | 0.04 |
| 8-3 | $1.5 \times 10^{-4}$ | 7/1 | 10/1 | 3.2 | 0.05 |
| 8-4 | $8.0 \times 10^{-5}$ | 6/1 | 8/1 | 2.8 | 0.08 |
| 8-5 | $4.0 \times 10^{-5}$ | 5/1 | 7/1 | 2.5 | 0.1 |

EXAMPLE 9

Films were formed under the same conditions as in Example 2 except that the power output of light source was changed as shown in Table 16. Results of evaluation are shown in Table 17.

TABLE 16

| | Sample No. | | | |
|---|---|---|---|---|
| | 9-1 | 9-2 | 9-3 | 9-4 |
| Output of Xe lamp (W) | 0.1 | 0.5 | 2.0 | 3.0 |

TABLE 17

| Sample No. | $\sigma d$ ($\Omega\ cm^{-1}$) | X-ray diffraction (2,2,0)/(1,1,1) | (2,2,0)/(4,0,0) | Grain size ($\mu m$) | H content (atomic) % |
|---|---|---|---|---|---|
| 9-1 | $4.0 \times 10^{-5}$ | 5/1 | 7/1 | 2.4 | 0.8 |
| 9-2 | $7.0 \times 10^{-5}$ | 6/1 | 8/1 | 2.6 | 0.6 |
| 9-3 | $1.0 \times 10^{-4}$ | 8/1 | 12/1 | 3.5 | 0.04 |
| 9-4 | $1.1 \times 10^{-4}$ | 10/1 | 12/1 | 3.5 | 0.01 |

EXAMPLE 10

Figure 3:
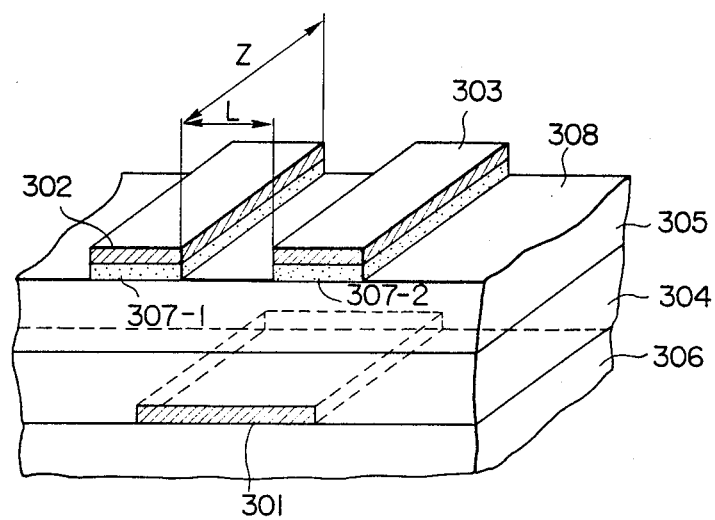
FIG. 3 is a partial perspective view illustrating schematically the constitution of the thin film transistor (TFT) prepared by use of the semiconductive deposited film prepared according to the process of the present invention.
Figure 4A:
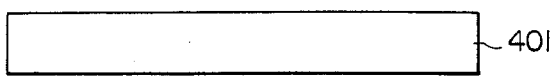
FIG. 4 and FIG. 5 each illustrate schematically the steps for preparing the substrate to be used in the present invention.
Figure 4B:
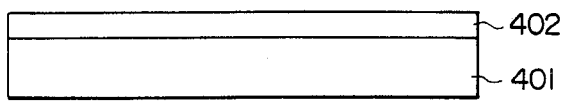
Figure 4C:
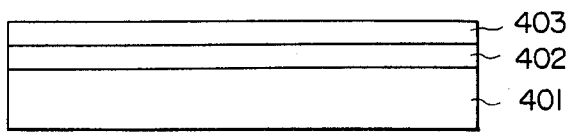
Figure 4D:
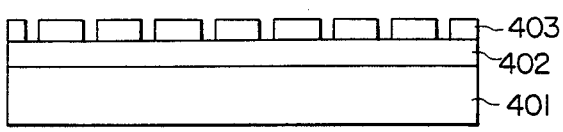
Figure 4E:
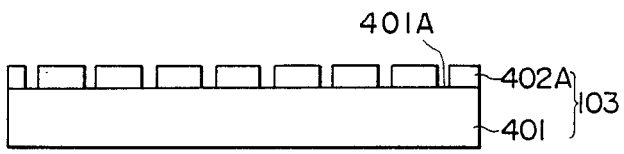
Figure 4F:
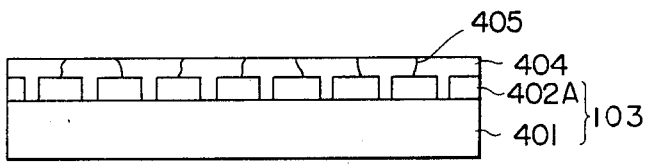
Figure 5A:
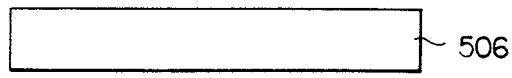
Figure 5B:
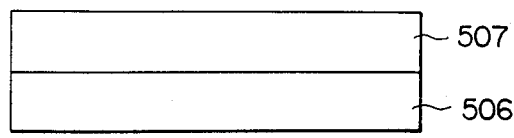
Figure 5C:
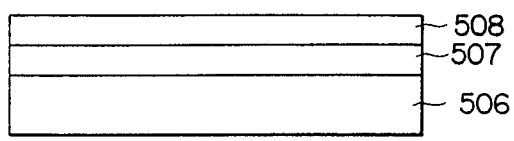
Figure 5D:
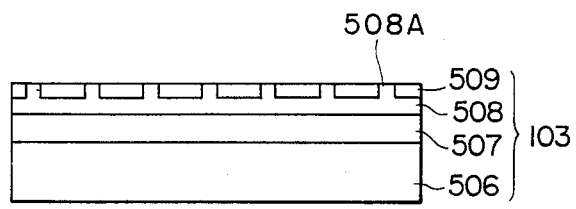
Figure 5E:
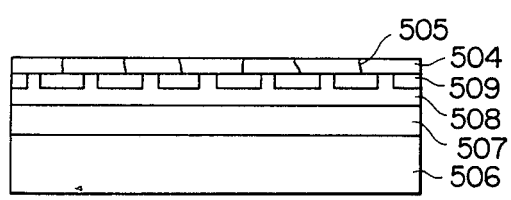

FIG. 3 is an oblique partial view which diagrammatically shows the structure of a thin film transistor (referred to as "TFT" hereinafter) of which semiconductor sections were constructed of polycrystalline silicon formed by this Example. The polycrystalline silicon TFT shown in FIG. 3 was formed by consecutive lamination of a gate electrode 301, an electrically insulating layer 304 covering said gate electrode 301, and a semiconductor layer 305 comprising polycrystalline silicon on a substrate 306 of glass, ceramics, etc. On the surface 308 of semiconductor layer 305 were juxtaposed a first n+ layer 307-1 and a second n+ layer 307-2 at an interval and further, on the first n+ layer 307-1 was provided source electrode 302 and on the second n+ layer 307-2 was drain electrode 303.

The first n+ layer 307-1 and the second n+ layer 307-2 provided on the surface (green surface) 308 of semiconductor layer 305 in contact with the surface were formed without exposing the surface 308 to atmosphere or oxygen after the semiconductor layer 305 was formed. The distance L between the source electrode 302 and drain electrode 303 was 50 $\mu$ and the length Z of them was 10 mm. The polycrystalline silicon film 305 was prepared in the following manner. Firstly, an insulating layer 304 provided on the substrate 306 was formed by similar steps to those in Example 2. That is, the gate electrode 301 was previously provided on the substrate 306 and then an A-SiN thin film was formed at about 2 $\mu$ thick on the whole surface of substrate 306 by CVD process. Subsequently, the A-SiN thin film was subjected to surface annealing in $N_2$ atmosphere by a laser annealing apparatus to form $C-Si_3N_4$ layer to the depth of 1 $\mu m$ in the surface layer of A-SiN thin film. Subsequently, the surface of this $C-Si_3N_4$ layer was subjected to scanning by said laser annealing apparatus in $O_2$ atmosphere to selectively form $SiO_2$ regions. Through these steps, there was formed a substrate where $C-Si_3N_4$ was exposed at constant intervals and other part was covered with $SiO_2$ region. The regions of the exposed $C-Si_3N_4$ on the substrate surface had a diameter of about 4 Å and were arranged at an interval of 3 $\mu m$.

The semiconductor layer 305 in this Example was formed under the same conditions as for sample No. 2, 3-2 shown in Tables 3 and 5.

The above TFT samples (Nos. 10-1 and 10-2) were prepared by using the above semiconductor deposited films. For these TFT samples, characteristics when the drain electrode was grounded and ⊕ voltages were applied to the source electrode and the gate electrode with variation were measured.

With reference to drain current $I_D$-drain voltage $V_D$ characteristics, saturated characteristics were obtained for both Nos. 10-1 and 10-2 and a high current of $5\times10^{-3}$ A was obtained at gate voltage 10 V and drain voltage 10V. TFT characteristics obtained from the results by measuring drain current $I_D$ with changing gate voltage $V_G$ are shown in Table 18.

From the above results, it was recognized that TFT using the obtained polycrystalline silicon exhibited good characteristics.

TABLE 18

| | Sample No. | |
|---|---|---|
| | 10-1 | 10-2 |
| Ratio of maximum value and minimum value of drain current* | $5 \times 10^6$ | $8 \times 10^6$ |
| Mobility of electric field effect ($cm^2/v \cdot sec$)** | 250 | 300 |
| Threshold voltage | 1.0 | 0.8 |

*Measured with changing gate voltage (Drain voltage $V_D$ = 10V constant)
**Calculated from $\sqrt{I_D}$ − V dependency.

The semiconductor layer of same No. 10-1 was formed under the same film forming conditions as for No. 2, and that of sample No. 10-2 was formed under the same conditions as for sample No. 3-2.

I claim:

1. A process for forming a crystalline deposited film on a substrate in a film forming space, said substrate having a surface, which comprises:
   (a) preparing the surface on which spaced crystal nuclei are present for forming said crystalline deposited film;
   (b) forming said crystalline deposited film on said surface of said substrate by separately introducing into said film forming space an activated species (A) formed by decomposition of a compound (SX) containing silicon and a halogen and an activated species (B) formed from a chemical substance for film formation (B) which is chemically mutually reactive with said activated species (A) to form a mixture and effect chemical reaction therebetween to thereby effect the formation of the crystalline deposited film, said crystalline deposited film having a surface;
   (c) producing an etching action on the crystalline deposited film by exposing the crystalline deposited film surface to a gaseous substance (E) capable of effecting an etching action thereon, and thereby effecting crystal growth in a specific face direction;
   (d) irradiating said gaseous substance (E) with light energy to thereby increase the etching activity thereof.

2. A process for forming a deposited film according to claim 1, wherein said compound (SX) is a chain halogenated silicon represented by the formula $Si_uY_{2u+2}$ (wherein u is an integer of 1 or more, Y is at least one element selected from F, Cl, Br and I).

3. A process for forming a deposited film according to claim 1, wherein said compound (SX) is a chain or cyclic halogenated silicon represented by the formula $Si_uH_xY_y$ (wherein u, x, y are integers of 1 or more, $x+y=2u$ or $x+y=2u+2$, and y is at least one element selected from F, Cl, Br and I).

4. A process for forming a deposited film according to claim 1, wherein either one of hydrogen and halogen is used in addition to said compound (SX) during decomposition of said compound (SX).

5. A process for forming a deposited film according to claim 1, wherein said chemical substance (B) for film formation is either one of hydrogen gas and halogen gas.

6. A process for forming a deposited film according to claim 1, wherein the flow rate ratio of said active species (A) and said active species (B) when introduced into the film-forming space is 10:1 to 1:10.

7. A process for forming a deposited film according to claim 1, wherein a compound containing an impurity element as the component is permitted to coexist with said compound (SX) during formation of said activated species (A).

8. A process for forming a deposited film according to claim 1, wherein a compound containing an impurity element as the component is permitted to coexist with said chemical substance (B) for film formation during formation of said activated species (B).

9. A process for forming a deposited film according to claim 1, wherein an activated species (D) formed from a compound containing an impurity element as the component is introduced into said film-forming space.

10. A process of forming a deposited film according to claim 1, wherein said gaseous substance (E) is formed from a gaseous substance (E₂), said gaseous substance (E₂) having been introduced in said film forming space.

* * * * *

UNITED STATES PATENT AND TRADEMARK OFFICE
CERTIFICATE OF CORRECTION

PATENT NO. : 4,918,028
DATED : April 17, 1990
INVENTOR(S) : SHIGERU SHIRAI

Page 1 of 4

It is certified that error appears in the above-identified patent and that said Letters Patent is hereby corrected as shown below:

Title page:

IN [56] REFERENCES CITED

U.S. PATENT DOCUMENTS, "Mathews et al." should read --Matthews, deceased et al.--.

COLUMN 1

Line 25, "commerciallized" should read --commercialized--.
Line 42, "apparatuses" should read --these apparatuses--.
Line 45, "have" should read --has--.
Line 62, "etc)," should read --etc.),--.

COLUMN 2

Line 18, "side" should read --size--.
Line 37, "mass production" should read --mass-production--.

COLUMN 4

Line 7, "film forming" should read --film-forming--.
Line 24, "film forming" should read --film-forming--.
Line 27, "is" should be deleted.
Line 35, "film forming" should read --film-forming--.
Line 64, "eg.," should read --e.g.,--.

COLUMN 5

Line 40, "film forming" should read --film-forming--.
Line 47, "film forming" should read --film-forming--.

UNITED STATES PATENT AND TRADEMARK OFFICE
CERTIFICATE OF CORRECTION

PATENT NO. : 4,918,028
DATED : April 17, 1990
INVENTOR(S) : SHIGERU SHIRAI

It is certified that error appears in the above-identified patent and that said Letters Patent is hereby corrected as shown below:

COLUMN 7

Line 10, "film forming" should read --film-forming--.
Line 66, "flat, film forming" should read
        --fact, film-forming--.
Line 67, "than" should read --over--.
Line 68, "b sides" should read --besides--.

COLUMN 8

Line 22, "on" should read --an--.
Line 31, "depostion" should read --deposition--.
Line 48, "compounds" should read --compound--.
Line 58, "film forming" should read --film-forming--.

COLUMN 9

Line 41, "were" should read --was--.
Line 44, "film forming" should read --film-forming--.

COLUMN 10

Line 4, "With" should read --While-- and "film forming"
        should read --film-forming--.
Line 50, "film forming" should read --film-forming--.

COLUMN 11

TABLE 2, "$\sqrt{\Omega}$" should read --$\mho$--.
Line 66, "4Åand" should read --4Å and--.

UNITED STATES PATENT AND TRADEMARK OFFICE
CERTIFICATE OF CORRECTION

PATENT NO. : 4,918,028
DATED : April 17, 1990
INVENTOR(S) : SHIGERU SHIRAI

Page 3 of 4

It is certified that error appears in the above-identified patent and that said Letters Patent is hereby corrected as shown below:

COLUMN 12

Line 24, "uneveness" should read --unevenness--.
TABLE 3, "$\Omega$" should read --$U$--.
TABLE 5, "$\Omega$" should read --$U$--.

COLUMN 13

TABLE 7, "$\Omega$" should read --$U$--.
Line 66, "film forming" should read --film-forming--.

COLUMN 14

TABLE 9, "$\Omega$" should read --$U$--.
TABLE 11, "$\Omega$" should read --$U$--.

COLUMN 15

TABLE 13, "$\Omega$" should read --$U$--.
TABLE 15, "$\Omega$" should read --$U$--.

TABLE 15, "

| X-ray diffraction | Grain size | H content (a-tomic) |

" should read --

| X-ray diffraction | Grain size | H content (atomic) |

--.

UNITED STATES PATENT AND TRADEMARK OFFICE
CERTIFICATE OF CORRECTION

PATENT NO. : 4,918,028
DATED : April 17, 1990
INVENTOR(S) : SHIGERU SHIRAI

It is certified that error appears in the above-identified patent and that said Letters Patent is hereby corrected as shown below:

COLUMN 15

TABLE 17, "μΩ" should read --$U$--.

COLUMN 17

Line 4, "Nos. 10-1and" should read --Nos. 10-1 and--.
  Line 35, "film forming" should read --film-forming--.

COLUMN 18

Line 8, "direction;" should read --direction; and--
  Line 21, "y" should read --Y--.

Signed and Sealed this

Twenty-fourth Day of November, 1992

Attest:

DOUGLAS B. COMER

Attesting Officer

Acting Commissioner of Patents and Trademarks